(12) United States Patent
Nuqui

(10) Patent No.: US 10,763,663 B2
(45) Date of Patent: Sep. 1, 2020

(54) HIGH SPEED PROTECTION OF POWER TRANSMISSION LINES

(71) Applicant: ABB Power Grids Switzerland AG, Baden (CH)

(72) Inventor: Reynaldo Nuqui, Cary, NC (US)

(73) Assignee: ABB Power Grids Switzerland AG, Baden (CH)

( * ) Notice: Subject to any disclaimer, the term of this patent is extended or adjusted under 35 U.S.C. 154(b) by 332 days.

(21) Appl. No.: 15/906,486

(22) Filed: Feb. 27, 2018

(65) Prior Publication Data

US 2019/0267796 A1    Aug. 29, 2019

(51) Int. Cl.
| | |
|---|---|
| H02H 7/26 | (2006.01) |
| G01R 31/08 | (2020.01) |
| H02H 1/00 | (2006.01) |
| H02H 3/16 | (2006.01) |

(52) U.S. Cl.
CPC ............ *H02H 7/26* (2013.01); *G01R 31/085* (2013.01); *H02H 1/0007* (2013.01); *H02H 3/165* (2013.01); *H02H 7/265* (2013.01)

(58) Field of Classification Search
CPC ........ H02H 7/26; H02H 7/265; H02H 1/0007; H02H 3/165; G01R 31/085
See application file for complete search history.

(56) References Cited

U.S. PATENT DOCUMENTS

| | | | |
|---|---|---|---|
| 3,956,671 A * | 5/1976 | Nimmersjo | H02H 1/04 361/111 |
| 4,183,072 A | 1/1980 | Takagi et al. | |
| 4,296,452 A * | 10/1981 | Eriksson | H02H 1/0046 361/111 |
| 4,390,835 A | 6/1983 | Elkateb et al. | |
| 4,438,475 A | 3/1984 | Haley | |
| 4,686,601 A | 8/1987 | Alexander et al. | |
| 6,144,721 A | 11/2000 | Stephens | |
| 9,007,733 B2 * | 4/2015 | Wang | G01R 31/085 361/62 |
| 9,594,112 B2 | 3/2017 | Schweitzer, III et al. | |
| 9,627,881 B2 * | 4/2017 | Schweitzer, III | G01R 31/2836 |

(Continued)

FOREIGN PATENT DOCUMENTS

| | | |
|---|---|---|
| CN | 102780212 | 11/2012 |
| WO | 2016037335 A1 | 3/2016 |

OTHER PUBLICATIONS

Extended European Search Report, EP Appln. No. 19159331.8, dated Jul. 31, 2019, 7 pgs.

*Primary Examiner* — Scott Bauer
(74) *Attorney, Agent, or Firm* — Slater Matsil, LLP

(57) ABSTRACT

The present application is directed to a three phase power transmission system including a first conductor line, a second conductor line and a third conductor line. One or more sensors are configured to detect traveling waves in each of the first second and third conductors. A controller is configured to receive data transmitted by the one or more sensors and determine which of the traveling modal waves is a first metallic mode wave (MM1), a second metallic mode (MM2) wave and/or a ground mode (GM0) wave. The controller is operable to determine which of the conductor lines are faulted based on detection of one or more of MM1 waves, MM2 waves and/or GM0 waves.

20 Claims, 6 Drawing Sheets

(56) References Cited

U.S. PATENT DOCUMENTS

| | | | |
|---|---|---|---|
| 2004/0189317 A1* | 9/2004 | Borchert | G01R 31/085 |
| | | | 324/512 |
| 2008/0077336 A1 | 3/2008 | Fernandes | |
| 2010/0152910 A1 | 6/2010 | Taft | |
| 2011/0216451 A1 | 9/2011 | Haines et al. | |
| 2016/0359424 A1 | 12/2016 | Tran et al. | |
| 2017/0117701 A1 | 4/2017 | Johannesson | |
| 2018/0203056 A1* | 7/2018 | Dzienis | G01R 31/50 |

* cited by examiner

| | Generated Waves | | | | | |
|---|---|---|---|---|---|---|
| | MM1 | MM1 | MM1 | MM2 | MM2 | MM2 |
| Faulted Conductor | A | B | C | A | B | C |
| A | x | x | x | x | | x |
| B | x | x | x | | | |
| C | x | x | x | x | | x |

HIGH SPEED PROTECTION OF POWER TRANSMISSION LINES

TECHNICAL FIELD

The present application generally relates to high speed detection of transmission line faults and more particularly, but not exclusively to fault identification and protection based on metallic modal components and ground modal components of a traveling wave generated by the fault.

BACKGROUND

Faults such as those generated by short circuits in high voltage electrical power transmission lines can cause overloading and thermal failures in the electrical network. If not detected quickly, a fault can bring the electrical system down in a matter of seconds. Present solutions for detecting and isolating such faults require a large number data points to be taken and transmitted to an electronic control processor to analyze the data and perform prepressing calculations such as Fourier Transform calculations or the like prior to determining whether a fault has occurred. These analyses take valuable time during which failures in the system may occur. Accordingly, there remains a need for further contributions in this area of technology.

SUMMARY

One embodiment of the present application is a unique system to detect and isolate a fault in a high voltage power transmission line. Other embodiments include apparatuses, systems, devices, hardware, methods, and combinations for detecting faults in a power transmission line that includes detection of metallic mode traveling waves and ground mode traveling waves generated by a short circuit or the like. Further embodiments, forms, features, aspects, benefits, and advantages of the present application shall become apparent from the description and figures provided herewith.

DETAILED DESCRIPTION OF THE ILLUSTRATIVE EMBODIMENTS

Figures 1A, 1B:
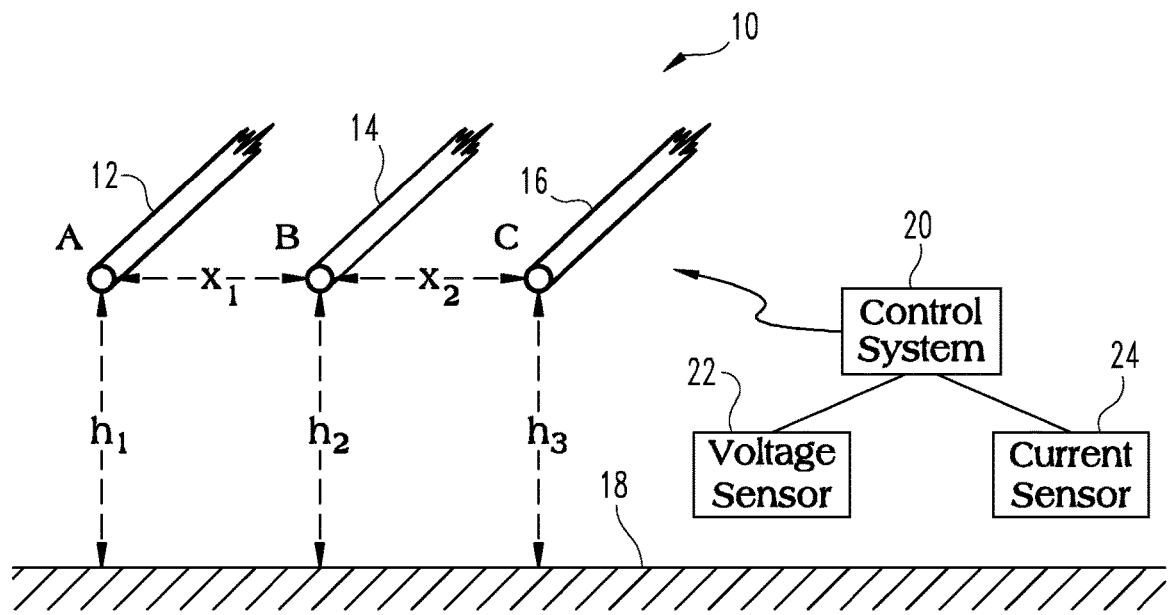
FIG. 1A is a schematic view of an exemplary power transmission system with a three phase conductor overhead arrangement.
FIG. 1B is a table illustrating voltage waves generated by a fault in the conductors shown in FIG. 1A.

For the purposes of promoting an understanding of the principles of the application, reference will now be made to the embodiments illustrated in the drawings and specific language will be used to describe the same. It will nevertheless be understood that no limitation of the scope of the application is thereby intended. Any alterations and further modifications in the described embodiments, and any further applications of the principles of the application as described herein are contemplated as would normally occur to one skilled in the art to which the application relates.

Power systems are being pushed towards their operating limits due to load growth, delay in entry of new transmission lines and entry of variable energy resources. Stability limits are being approached requiring improved control and faster protection. In the latter, faster and more secure protection methods and systems must be developed to address these challenges. High voltage transmission line protection must take advantage of increased availability of high sampling signal processing systems to increase the speed of protection. This invention takes advantage of high sampling technology to sample high frequency transients particularly traveling waves. An algorithm that quickly makes decisions on the existence of a fault based on a few samples of the incident traveling wave is a clear differentiator in the AC protection market that is dominated by relatively slower sampling rates.

When a fault occurs, it will generate voltage traveling waves in all conductors. Each of these traveling waves can be decomposed into its equivalent "modal" voltages using modal transformation. In a three conductor untransposed system, it was confirmed by theory and simulation that there are (three modes) of traveling waves. Two of these modes are metallic modes referred to as Metallic Mode 1 (MM1) and Metallic Mode 2 (MM2); the third mode is a ground mode referred here as Ground Mode 0 (GM0). The GM0 is present in all conductors and flows through ground. MM1 travels in the metallic path through all of the phase conductors. MM2 travels only in the outer conductors (B and C). MM1 travels the fastest of the three waves with a speed approaching the speed of light in overhead conductors. MM2 travels at a slower rate of speed to that of MM1. The GM0 travels slower than either MM1 or MM2. It should be noted that traveling waves travel at a slower speed in non-overhead cables, however the relative speeds of travel of the are proportional to that of overhead conductors.

The modal voltages $E_m$ are related to the phase voltages E through the voltage transformation matrix $[T_e]$ according to the relationship $$E = [T_e]E_m \quad (1)$$

Similarly, the modal currents $I_m$ are related to the phase currents I through the current transformation matrix $[T_i]$ according to the relationship $$I = [T_i]I_{im} \quad (2)$$

Conversely, the phase voltages E are related to modal voltages $E_m$ through the inverse of the voltage transformation matrix $[T_e]^{-1} = [Te,inv]$ according to the relationship $$Em = [T_{e,inv}]E \quad (3)$$

The phase currents I are related to modal currents $I_m$ through the inverse of the current transformation matrix $[Ti]^{-1} = [T_{1,inv}]$ according to the relationship $$I_m = [T_{inv}]I \quad (4)$$

When the system is excited in the phase domain with fault voltage $E_f$ in one conductor, then correspondingly the system is excited in the modal domain. For example, during a positive pole to ground fault in a three conductor system with conductor arranged in sequence of positive pole, metallic return, and negative pole, the fault voltage $[E_f\ 0\ 0]$ will excite a vector of fault modal voltages of $[E_{m,0},\ E_{m,1}\cdot E_{m,2}]$ corresponding to GM0, MM1, and MM2 excitation voltage so the excited modal voltages can be determined at the point of a fault using the inverse of the voltage transformation matrix.

When the traveling wave arrives at the station, the magnitude of these same exciting modal voltages are determined from the measured phase voltages. At that time, due to surge impedance of the overhead transmission line the amplitude of these voltages will have decreased when they reach the station. A fault will produce traveling waves in all conductors. The magnitude of the wave on the faulted phase typically results in the wave with the highest magnitude.

The voltage traveling wave at the faulted phase will arrive at the station with a polarity equal to that of the impressed voltage at the fault point. A fault in the outer conductors (Phase A & C) includes the superposition of the two metallic modes MM1 and MM2. A fault in the middle conductor (Phase B) generated only a MM1 wave. The direction of the other voltage wave arriving at the station from the unfaulted phases will be opposite in polarity.

A protection function designed for the metallic modal waves can occur with a fast sampling rate fault detection in approximately 10 microseconds after the initial wave is detected at the station. The speed of the fault detection can be equivalent to the speed of the incident traveling wave of voltage or current arriving at the station. In three phase overhead lines for example, the traveling wave travels at close to the speed of light.

Referring to FIG. 1, a three phase power transmission system 10 is illustrated in schematic form. The three phase power transmission system 10 includes a first conductor line 12, a second conductor line 14 and a third conductor line 16 corresponding to Phase A, Phase B, and Phase C, respectively. The conductor lines 12, 14 and 16 are operable to transmit electrical power from a power source to an electrical load. The power source can include power generation from standard means such as hydro generators or the like as well as alternative sources such as solar and wind power or the like. The first conductor 12 can be positioned at a height $h_1$ above a ground 18, the second conductor can be positioned at a height $h_2$ above the ground 18 and the third conductor can be positioned at a height $h_3$ above the ground 18. In one form, each of the heights $h_1$, $h_2$ and $h_3$ can be substantially equivalent to one another, however in other forms, the heights can vary with respect to one another. Further, a distance $X_1$ defined between the first conductor 12 and the second conductor 14 and a distance $X_2$ defined between the second conductor line 14 and the third conductor can be substantially equivalent to one another. However in other forms, the distances $X_1$ and $X_2$ may be varied depending upon the requirement of the power transmission application. Furthermore, in some forms the first conductor 12, a second conductor 14 and a third conductor 16 may be positioned in a non-linear orientation. The power transmission system 10 may include a control system 20 operable for controlling the electric power that is conducted through each of the conductors 12, 14 and 16. The control system 20 can include an electronic controller, a memory, sensors, communications lines, and other electronic components as one skilled in the art would understand. The sensors can include a voltage sensor 22 and current sensor 24. Other types of sensors may be utilized by the control system 20 such as temperature sensors, or the like. When a fault occurs in one of the conductor lines 12, 14 or 16, due to various causes such as a short circuit or the like, one or more travelling waves are generated through the conductors 12, 14 or 16.

Referring now to FIG. 1B, a table illustrating a faulted conductor, either conductor A, conductor B or conductor C and the voltage waves generated in each of the conductors as a function of the faulted conductor. When a fault occurs in conductor A, a MM1 wave is generated in each of the conductors A, B and C, and a MM2 wave is generated through only conductor A and Conductor C. Although not shown, a fault will generate a relatively slow GM0 wave in each conductor 12, 14 and 16. When a fault is generated in conductor B, a MM1 wave is generated in each of these line conductors A, B and C, however there are no MM2 voltage generated waves in any of the conductors A, B or C. When a fault is generated in conductor C, each of the conductors A, B or C will propagate an MM1 wave therethrough and a MM2 wave is generated in conductor A and conductor C, however no MM2 waves are generated in conductor B.

Figure 2:
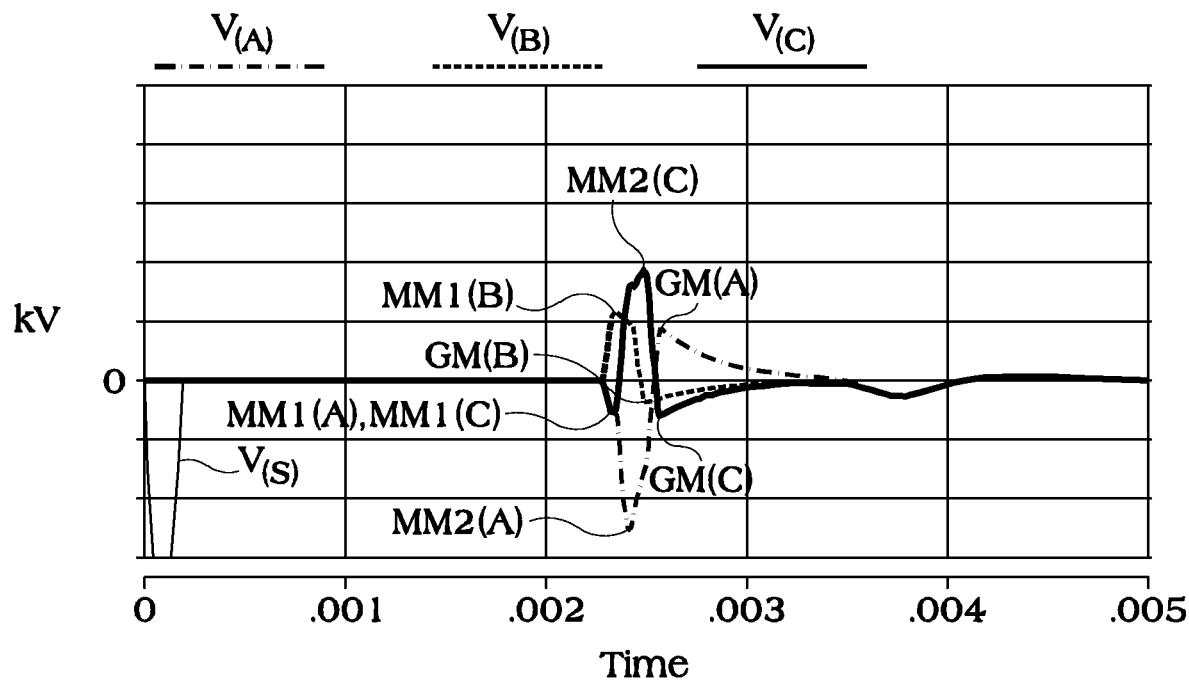
FIG. 2 is an exemplary graph of traveling voltage waves induced by a negative voltage pulse input into the phase A conductor.
Figure 3:
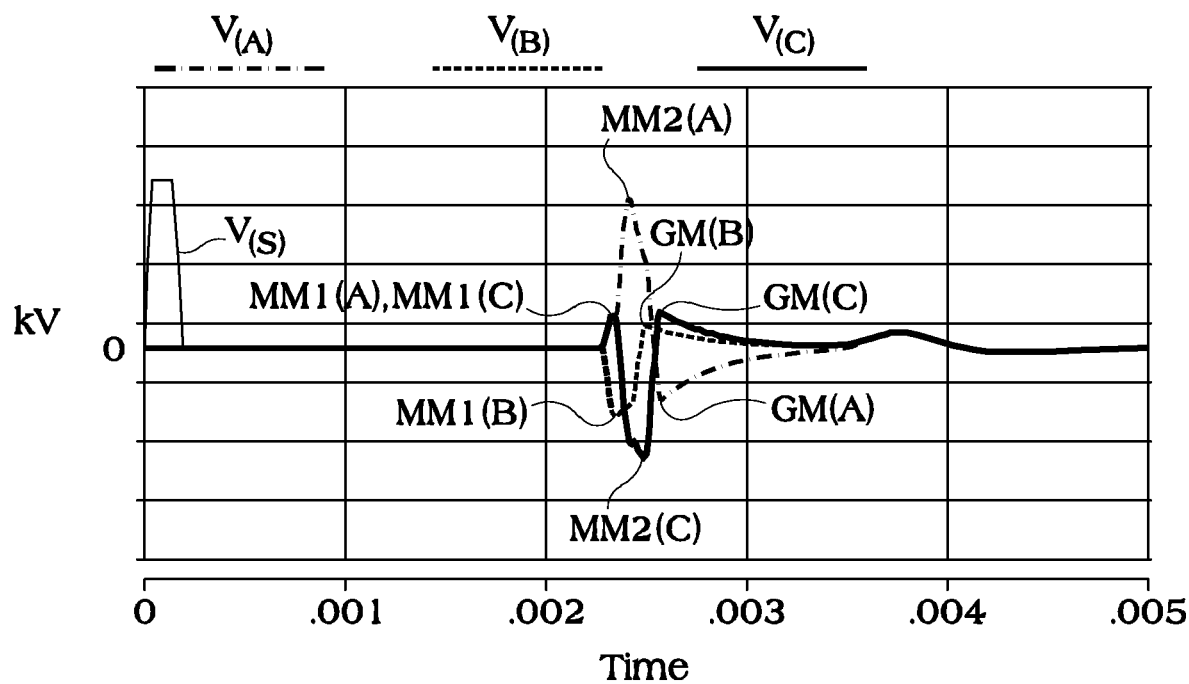
FIG. 3 is an exemplary graph of traveling voltage waves induced by a positive voltage pulse input into the phase A conductor.

Referring now to FIGS. 2 and 3, voltage waves are generated in line measurements A, B, and C for a phase-A pulse voltage input generated at the fault location 600 kilometers away. The phase voltage can be generated by a fault in line 12 (FIG. 1A) such as an open circuit or a short circuit. As explained above, the modal voltage traveling waves move at different speeds. MM1 waves move the fastest, followed by MM2 waves and slowest being GM0 waves. The traveling waves in FIG. 2 result from a negative voltage pulse $V_{(s)}$ input at the fault location corresponding to a fault during the positive half cycle. The traveling waves in FIG. 3 result from a positive voltage pulse $V_{(s)}$. In an AC system the fault voltage can either be positive or negative depending on the point on the wave when the fault occurs. The voltage spike level $V_{(s)}$ is generated by a fault located 600 km away from the major location in the first conductor line 12. A MM1, MM2 and GM0 waves generated in the first conductor line 12. A MM1 wave and a GM0 wave is generated in the second conductor line 14. A MM2 wave is generated in a third conductor line 16. A voltage pulse is generated in each of the conductors A, B and C as illustrated and can be seen that the MM1 phase in the conductors B and C travels faster than GM0. The control system 20 is operably connected to the voltage sensor 22 and the current sensor 24 and can determine which of the conducting conduits 12, 14 and 16 have a fault based on the voltage signals. The control system 20 can sense a fault as fast as 10 microseconds and then subsequently cut power off through any of the faulted conductors.

Figure 4:
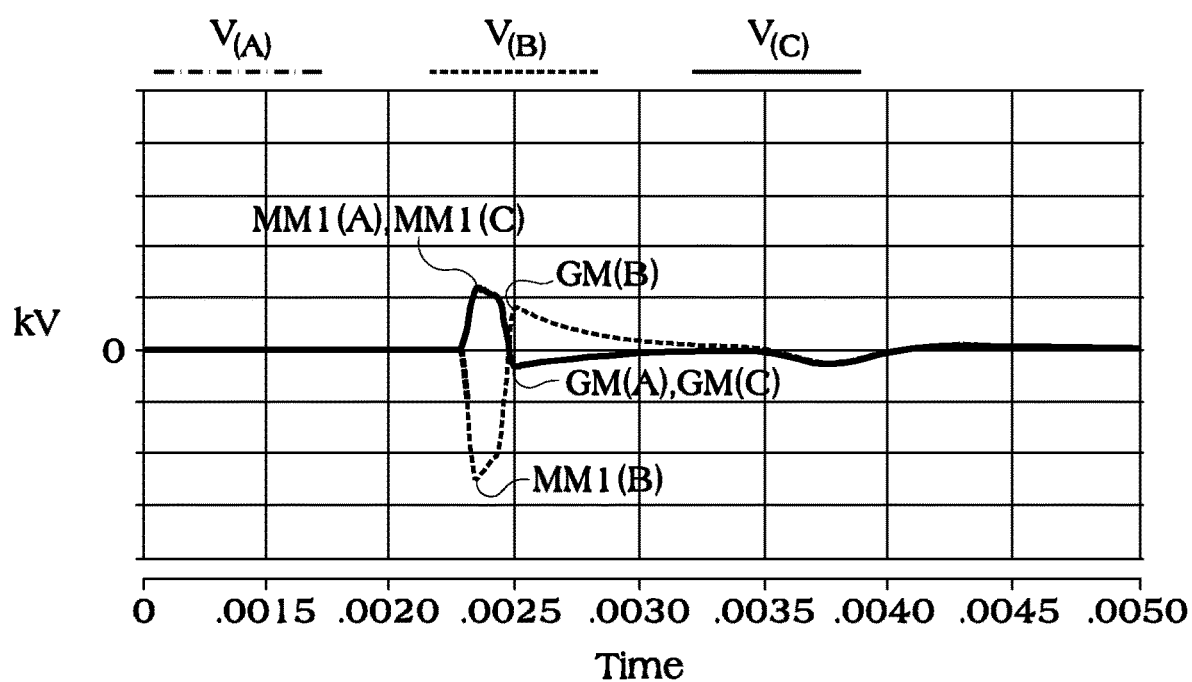
FIG. 4 is an exemplary graph of traveling voltage waves induced by a negative voltage pulse input into the phase B conductor.

Referring now to FIG. 4, for a fault in the middle conductor line 14 or phase B, no MM2 voltage waves are generated at the fault location. Only the MM1 and the GM0 voltage waves are generated. These modal waves will travel towards the station with the MM1 wave arriving first followed by the GM0 wave as shown.

Figure 5A:
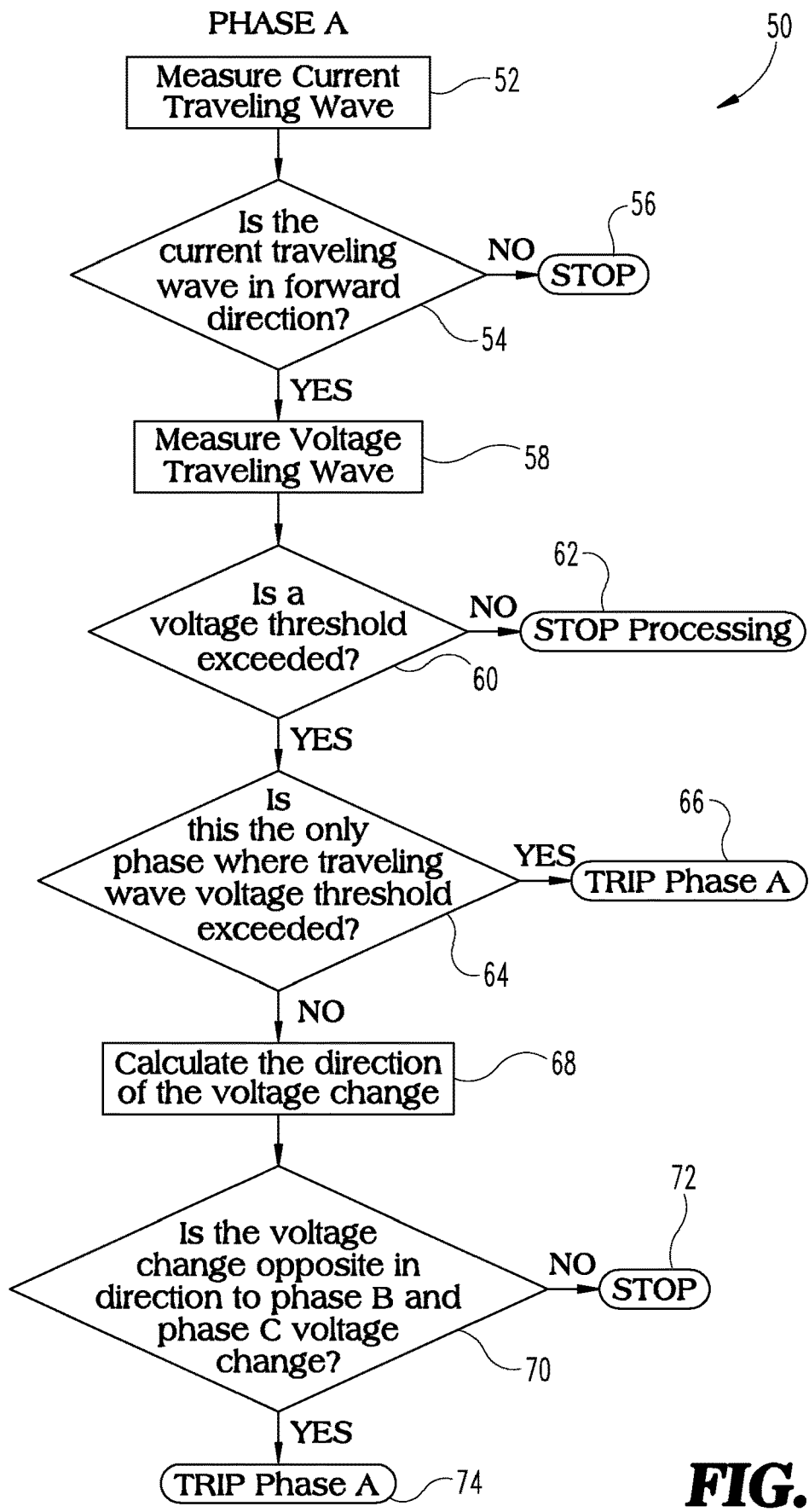
FIG. 5A is a flow chart illustrating a control algorithm for the phase A conductor.

Referring to FIG. 5A, a method 50 for determining whether a fault has occurred in the Phase A conductor is illustrated. The method 50 begins at step 52 wherein a controller in a control system measures the current of a traveling wave in a first phase (Phase A) conductor. The controller system will determine at step 54 whether the traveling wave is moving in a forward direction as defined by a direction from a power source to a load. If the traveling wave is not moving in a forward direction, then the controller stops processing at step 56. If at step 54, the controller determines that the traveling wave is moving in a forward direction, then the controller proceeds to measure the voltage of the traveling wave, at step 58. If the voltage has not exceeded a predetermined threshold value, then the controller stops processing at step 62. If the voltage has exceeded a predetermined threshold value at step 60, then the controller will determine whether this is the only phase with a faulted conductor at step 64. If the answer to the query at step 64 is yes, then the controller will trip the Phase A conductor (i.e., cuts electrical power to the Phase A conductor). If the controller determines more than one phase has traveling waves that exceed a predetermined voltage threshold value level, then the controller will calculate the direction of the voltage change for each of the conductors at step 68. If at step 70, the controller determines that voltage change is in the same direction to that of the voltage change of the Phase B and Phase C conductors, then the controller stops processing at step 72. If the voltage change in Phase A is in an opposite direction to that of Phase B and Phase C, then the control system trips Phase A (i.e., cuts electrical power to the Phase A conductor) at step 74.

Figure 5B:
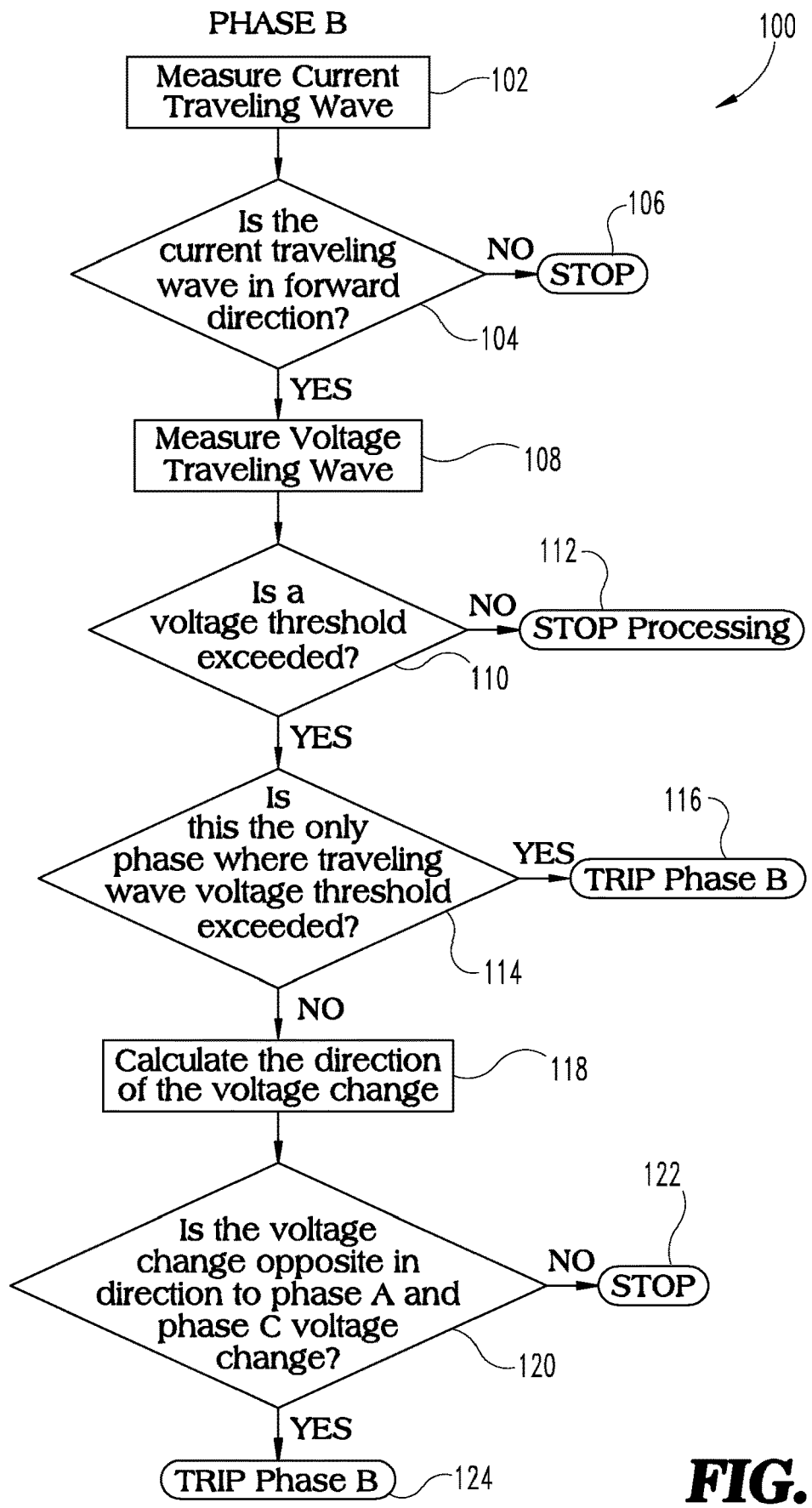
FIG. 5B is a flow chart illustrating a control algorithm for the phase B conductor.

Referring to FIG. 5B, a method 100 for determining whether a fault has occurred in the Phase B conductor is illustrated. The method 100 begins at step 102 wherein a controller in a control system measures the current of a traveling wave in a second phase (Phase B) conductor. The controller system will determine at step 104 whether the traveling wave is moving in a forward direction as defined by a direction from a power source to a load. If the traveling wave is not moving in a forward direction, then the controller stops processing at step 106. If at step 104, the controller determines that the traveling wave is moving in a forward direction, then the controller proceeds to measure the voltage of the traveling wave, at step 108. If the voltage has not exceeded a predetermined threshold value, then the controller stops processing at step 112. If the voltage has exceeded a predetermined threshold value at step 110, then the controller will determine whether this is the only phase with a faulted conductor at step 114. If the answer to the query at step 114 is yes, then the controller will trip the Phase B conductor (i.e., cuts electrical power to the Phase B conductor). If the controller determines more than one phase has traveling waves that exceed a predetermined voltage threshold value level, then the controller will calculate the direction of the voltage change for each of the conductors at step 118. If at step 120, the controller determines that voltage change is in the same direction to that of the voltage change of the Phase A and Phase C conductors, then the controller stops processing at step 122. If the voltage change in Phase B is in an opposite direction to that of Phase A and Phase C, then the control system trips Phase B (i.e., cuts electrical power to the Phase B conductor) at step 124.

Figure 5C:
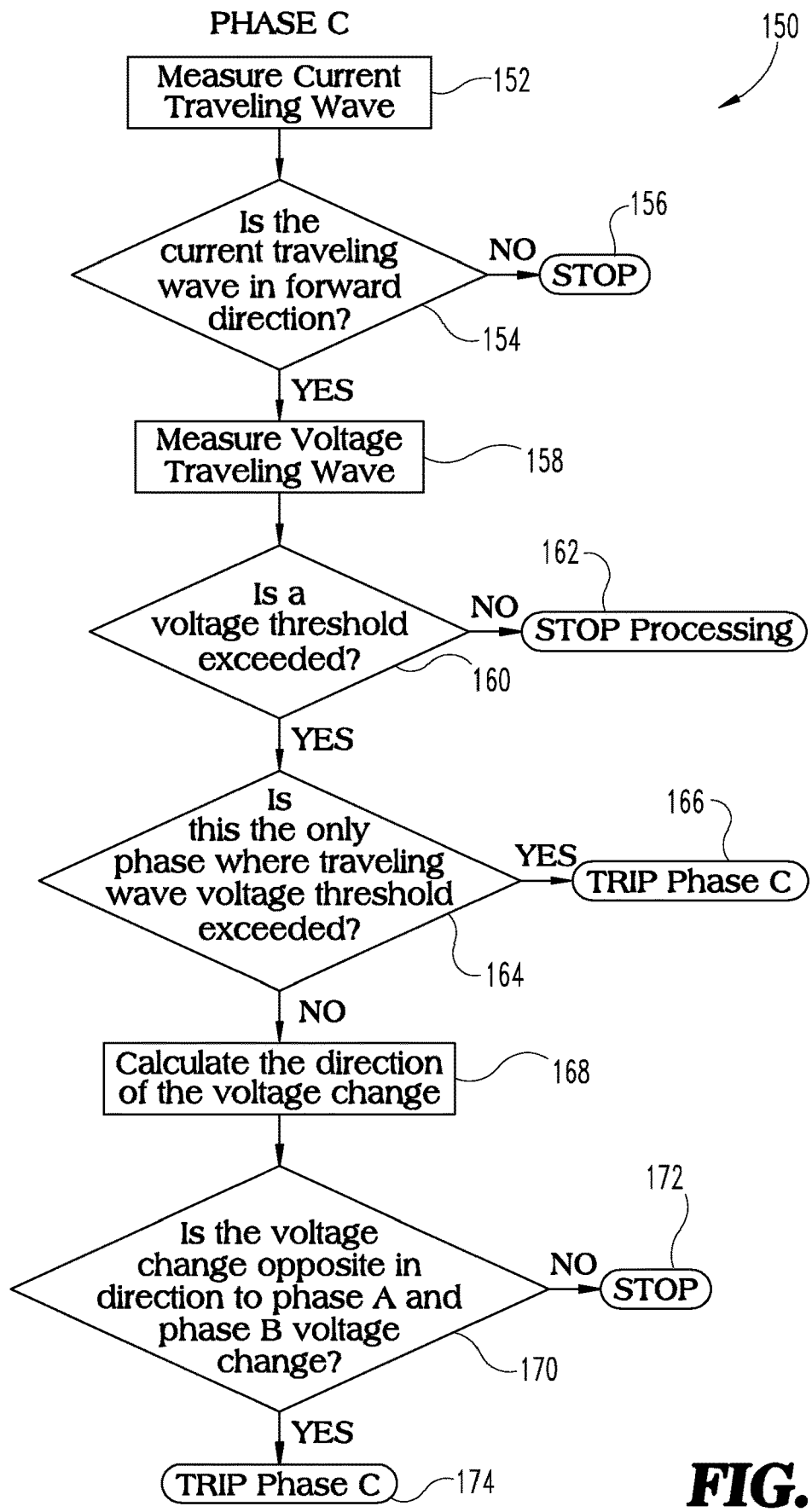
FIG. 5C is a flow chart illustrating a control algorithm for the phase C conductor.

Referring to FIG. 5C, a method 150 for determining whether a fault has occurred in the Phase C conductor is illustrated. The method 150 begins at step 152 wherein a controller in a control system measures the current of a traveling wave in a third phase (Phase C) conductor. The controller system will determine at step 154 whether the traveling wave is moving in a forward direction as defined by a direction from a power source to a load. If the traveling wave is not moving in a forward direction, then the controller stops processing at step 156. If at step 154, the controller determines that the traveling wave is moving in a forward direction, then the controller proceeds to measure the voltage of the traveling wave, at step 158. If the voltage has not exceeded a predetermined threshold value, then the controller stops processing at step 162. If the voltage has exceeded a predetermined threshold value at step 160, then the controller will determine whether this is the only phase with a faulted conductor at step 164. If the answer to the query at step 164 is yes, then the controller will trip the Phase C conductor (i.e., cuts electrical power to the Phase C conductor). If the controller determines more than one phase has traveling waves that exceed a predetermined voltage threshold value level, then the controller will calculate the direction of the voltage change for each of the conductors at step 168. If at step 170, the controller determines that voltage change is in the same direction to that of the voltage change of the Phase A and Phase B conductors, then the controller stops processing at step 172. If the voltage change in Phase C is in an opposite direction to that of Phase A and Phase B, then the control system trips Phase C (i.e., cuts electrical power to the Phase C conductor) at step 174.

In one aspect, the present disclosure includes a system comprising: a three phase power transmission system including a first conductor line, a second conductor line and a third conductor line; one or more sensors configured to detect traveling waves in each of the first second and third conductors; a controller operable for receiving data transmitted by the one or more sensors and determining which of the traveling modal waves is a first metallic mode wave, a second metallic mode wave and/or a ground mode wave; and wherein the controller is operable to determine which of the conductor lines are faulted based on detection of one or more of first metallic mode waves, second metallic mode waves and/or ground mode waves.

In refining aspects, the one or more sensors are voltage sensors; wherein the one or more sensors are current sensors; wherein a transmission speed of the first metallic mode is greater than the second metallic mode; wherein a transmission speed of the ground mode is slower than the second metallic mode; wherein the first and third conductor lines are outer lines and the second conductor line is an intermediate line positioned between the first and third conductor lines; wherein the first and third conductor lines transmit waves having opposite polarities; wherein the second metallic mode wave travels only through the first and third conductor lines; wherein the first metallic mode wave travels through each of the first, second and third conductor lines; wherein the ground mode travels through each of the first, second and third conductor lines; wherein the controller operable to identify a faulted line without prior processing of data transmitted by the sensors; and wherein the controller is configured to determine a faulted conductor line upon detection of a first metallic mode wave.

Another aspect of the present disclosure includes a method comprising: sensing a current traveling wave in a first conductor line, a second conductor line and a third conductor line of a three phase system; determining whether the current traveling wave is moving in a forward direction in the first conductor line, the second conductor line and the third conductor line; sensing a voltage traveling wave in the first conductor line, the second conductor line and the third conductor line; and shutting electrical power off to any of the conductor lines after detecting that the current traveling wave moving in the forward direction and the voltage traveling wave exceeds a predetermined threshold value.

In refining aspects, the voltage wave is generated by an electrical fault; further comprising sending a signal to shut off electrical power within 10 microseconds of the fault being detected; wherein the fault is generated by a short circuit; and wherein the traveling voltage wave is one of a metallic mode 1 traveling wave, a metallic mode 2 traveling wave and a ground mode 0 traveling wave.

Another aspect of the present disclosure includes a system comprising: first, second and third electrical conductor lines; one or more sensors configured to sense a voltage and a current flowing through the first, second and third electrical conductor lines; a controller in electrical communication with the one or more sensors; wherein the controller is operable to identify a first metallic mode wave, a second metallic mode wave and a ground mode wave generated by a fault in any of the first, second and third electrical conductor lines; and wherein the controller is further configured shut electrical power off to one or more of the first, second or third conductors when a metallic mode 1 traveling wave is detected.

In refining aspects, the controller is configured to send a signal to shut down power to a faulted conductor line within 10 microseconds of a fault being detected; and wherein the controller shuts down power to a faulted conductor line prior to performing process calculations of the sensed data.

While the application has been illustrated and described in detail in the drawings and foregoing description, the same is to be considered as illustrative and not restrictive in character, it being understood that only the preferred embodiments have been shown and described and that all changes and modifications that come within the spirit of the applications are desired to be protected. It should be understood that while the use of words such as preferable, preferably, preferred or more preferred utilized in the description above indicate that the feature so described may be more desirable, it nonetheless may not be necessary and embodiments lacking the same may be contemplated as within the scope of the application, the scope being defined by the claims that follow. In reading the claims, it is intended that when words such as "a," "an," "at least one," or "at least one portion" are used there is no intention to limit the claim to only one item unless specifically stated to the contrary in the claim. When the language "at least a portion" and/or "a portion" is used the item can include a portion and/or the entire item unless specifically stated to the contrary.

Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

What is claimed is:

1. A system comprising:
    a three phase power transmission system including a first conductor line, a second conductor line and a third conductor line;
    one or more sensors configured to detect traveling waves in each of the first second and third conductors;
    a controller operable for receiving data transmitted by the one or more sensors and determining which of the traveling modal waves is a first metallic mode wave, a second metallic mode wave and/or a ground mode wave; and
    wherein the controller is operable to determine which of the conductor lines are faulted based on detection of one or more of first metallic mode waves, second metallic mode waves and/or ground mode waves.

2. The system of claim 1, wherein the one or more sensors are voltage sensors.

3. The system of claim 1, wherein the one or more sensors are current sensors.

4. The system of claim 1, wherein a transmission speed of the first metallic mode is greater than the second metallic mode.

5. The system of claim 4, wherein a transmission speed of the ground mode is slower than the second metallic mode.

6. The system of claim 1, wherein the first and third conductor lines are outer lines and the second conductor line is an intermediate line positioned between the first and third conductor lines.

7. The system of claim 1, wherein the first and third conductor lines transmit waves having opposite polarities.

8. The system of claim 1, wherein the second metallic mode wave travels only through the first and third conductor lines.

9. The system of claim 1, wherein the first metallic mode wave travels through each of the first, second and third conductor lines.

10. The system of claim 1, wherein the ground mode travels through each of the first, second and third conductor lines.

11. The system of claim 1, wherein the controller operable to identify a faulted line without prior processing of data transmitted by the sensors.

12. The system of claim 11, wherein the controller is configured to determine a faulted conductor line upon detection of a first metallic mode wave.

13. A method comprising:
    sensing a current traveling wave in a first conductor line, a second conductor line and a third conductor line of a three phase system;
    determining whether the current traveling wave is moving in a forward direction in the first conductor line, the second conductor line and the third conductor line;
    sensing a voltage traveling wave in the first conductor line, the second conductor line and the third conductor line; and
    shutting electrical power off to any of the conductor lines after detecting that the current traveling wave moving in the forward direction and the voltage traveling wave exceeds a predetermined threshold value.

14. The method of claim 13, wherein the voltage wave is generated by an electrical fault.

15. The method of claim 14 further comprising sending a signal to shut off electrical power within 10 microseconds of the fault being detected.

16. The method of claim 14, wherein the fault is generated by a short circuit.

17. The method of claim 13 wherein the traveling voltage wave is one of a metallic mode 1 traveling wave, a metallic mode 2 traveling wave and a ground mode 0 traveling wave.

18. A system comprising:
    first, second and third electrical conductor lines;
    one or more sensors configured to sense a voltage and a current flowing through the first, second and third electrical conductor lines;
    a controller in electrical communication with the one or more sensors;
    wherein the controller is operable to identify a first metallic mode wave, a second metallic mode wave and a ground mode wave generated by a fault in any of the first, second and third electrical conductor lines; and
    wherein the controller is further configured shut electrical power off to one or more of the first, second or third conductors when a metallic mode 1 traveling wave is detected.

19. The system of claim 18, wherein the controller is configured to send a signal to shut down power to a faulted conductor line within 10 microseconds of a fault being detected.

20. The system of claim 18, wherein the controller shuts down power to a faulted conductor line prior to performing process calculations of the sensed data.

\* \* \* \* \*